(12) United States Patent
Moriyama et al.

(10) Patent No.: US 8,142,905 B2
(45) Date of Patent: Mar. 27, 2012

(54) COPPER FOIL FOR PRINTED CIRCUIT BOARD AND COPPER CLAD LAMINATE FOR PRINTED CIRCUIT BOARD

(75) Inventors: Terumasa Moriyama, Ibaraki (JP); Kengo Kaminaga, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 12/738,995

(22) PCT Filed: May 29, 2009

(86) PCT No.: PCT/JP2009/059839
§ 371 (c)(1),
(2), (4) Date: Apr. 21, 2010

(87) PCT Pub. No.: WO2009/154066
PCT Pub. Date: Dec. 23, 2009

(65) Prior Publication Data
US 2010/0261033 A1    Oct. 14, 2010

(30) Foreign Application Priority Data
Jun. 17, 2008 (JP) ................. 2008-157849

(51) Int. Cl.
*B32B 15/01* (2006.01)
*B32B 15/04* (2006.01)
*B32B 15/08* (2006.01)
*B32B 15/20* (2006.01)

(52) U.S. Cl. ........ 428/626; 428/607; 428/639; 428/658; 428/666; 428/674; 428/628; 428/629; 428/633; 428/340; 428/341; 428/334; 428/219; 428/220; 428/680; 174/250; 174/256

(58) Field of Classification Search ............. 428/606, 428/607, 612, 639, 640, 657, 658, 666, 674, 428/628, 629, 632, 633, 447, 626, 457, 448, 428/450, 340, 334, 335, 336, 341, 219, 220, 428/213, 214, 215, 680
See application file for complete search history.

(56) References Cited

U.S. PATENT DOCUMENTS

| | | | |
|---|---|---|---|
| 3,585,010 A | 6/1971 | Luce et al. | |
| 6,638,642 B2 | 10/2003 | Kitano et al. | |
| 6,833,198 B2 | 12/2004 | Sakamoto et al. | |
| 6,835,241 B2 | 12/2004 | Tsuchida et al. | |
| 6,960,391 B2 | 11/2005 | Natsume et al. | |
| 7,341,796 B2 | 3/2008 | Hanafusa | |
| 2002/0182432 A1 | 12/2002 | Sakamoto et al. | |
| 2004/0053019 A1 | 3/2004 | Yamamoto et al. | |
| 2004/0163842 A1 | 8/2004 | Okada et al. | |
| 2004/0209109 A1 | 10/2004 | Tsuchida et al. | |
| 2009/0162685 A1 | 6/2009 | Kobayashi et al. | |
| 2009/0208762 A1 | 8/2009 | Akase | |
| 2010/0018273 A1 | 1/2010 | Sato | |
| 2010/0040873 A1 | 2/2010 | Kohiki et al. | |
| 2010/0051451 A1 | 3/2010 | Sato | |
| 2010/0212941 A1 * | 8/2010 | Higuchi | 174/257 |

FOREIGN PATENT DOCUMENTS

| | | | |
|---|---|---|---|
| JP | 02-213495 A | | 8/1990 |
| JP | 05-140765 | * | 6/1993 |
| JP | 2005-048269 A | | 2/2005 |
| JP | 2006-142514 A | | 6/2006 |
| WO | WO 2009/041292 | * | 4/2009 |

OTHER PUBLICATIONS

Machine Translation, Hino et al., JP 05-140765, Jun. 1993.*

* cited by examiner

*Primary Examiner* — Michael Lavilla
(74) *Attorney, Agent, or Firm* — Howson & Howson LLP

(57) ABSTRACT

Provided is a copper foil for a printed circuit board comprising a layer including nickel, zinc, a compound of nickel and that of zinc (hereinafter referred to a "nickel zinc layer") on a roughened surface of a copper foil, and a chromate film layer on the nickel zinc layer, wherein the zinc add-on weight per unit area of the nickel zinc layer is 180 $\mu g/dm^2$ or more and 3500 $\mu g/dm^2$ or less, and the nickel weight ratio in the nickel zinc layer {nickel add-on weight/(nickel add-on weight+zinc add-on weight)} is 0.38 or more and 0.7 or less. This surface treatment technology of a copper foil is able to effectively prevent the circuit corrosion phenomenon in cases of laminating a copper foil on a resin base material and using a sulfuric acid hydrogen peroxide etching solution to perform soft etching to the circuit.

16 Claims, No Drawings

COPPER FOIL FOR PRINTED CIRCUIT BOARD AND COPPER CLAD LAMINATE FOR PRINTED CIRCUIT BOARD

BACKGROUND OF THE INVENTION

The present invention generally relates to a copper foil for a printed circuit board and a copper clad laminate for a printed circuit board having superior chemical resistivity and adhesiveness, and in particular relates to a copper foil for a printed circuit board comprising a layer including nickel, zinc, a compound of nickel and zinc (hereinafter referred to a "nickel-zinc layer") at least on an adherend surface with a resin of a copper foil, and a chromate film layer on the nickel zinc layer, and also comprising a silane coupling agent layer as needed, as well as to a copper clad laminate for a printed circuit board produced by using the foregoing copper foil.

A semiconductor package substrate is one type of printed circuit board, and is a printed circuit board that is used for mounting a semiconductor IC chip and other semiconductor devices. Since circuits that are formed on the semiconductor package substrate are finer than those formed on a standard printed circuit board, a resin base material that is different from a standard printed circuit board is used for the substrate material.

A semiconductor package substrate is generally manufactured according to the following processes. Foremost, a copper foil is laminated and bonded to a base material such as synthetic resin under high temperature and high pressure. This is referred to as a copper clad laminate or simply as a laminate. Subsequently, in order to form the intended conductive circuit on the laminate, a pattern such as resin with anti-etching properties is used to print a pattern that is equivalent to a circuit on the copper foil. The unwanted part of the exposed copper foil is eliminated by way of etching processing.

After the etching, the printed part is eliminated and a conductive circuit is formed on the substrate. Prescribed devices are ultimately soldered on the formed conductive circuit in order to form various printed circuit boards for electronic devices. This is ultimately bonded with a resist or buildup resin substrate.

Generally speaking, the quality demand of the copper foil for a printed circuit board differs with the adherend surface to be bonded with the resin base material (so-called roughened surface) and the non-adherend surface (so-called gloss surface), and it is necessary to simultaneously satisfy both demands.

Requirements of the gloss surface are as follows: (1) favorable appearance and no oxidative discoloration during the storage thereof, (2) favorable solder wettability, (3) no oxidative discoloration during high-temperature heating, and (4) favorable adhesion with the resist.

Meanwhile, main requirements of the roughened surface are as follows: (1) no oxidative discoloration during the storage thereof, (2) peel strength with the base material is sufficient even after high-temperature heating, wet processing, soldering, chemical treatment and the like, and (3) no so-called lamination contamination that occurs in etching after the lamination with the base material.

Moreover, pursuant to the finer circuit printed patterns in recent years, the lower degree of roughness of the copper foil surface is being demanded.

Further, with personal computers and electronic devices of mobile communication and the like, the higher frequency of electrical signals is progressing to accommodate faster speed and greater capacity of communication, and printed circuit boards and copper foils that are compatible with the foregoing demands are being sought. When the frequency of electrical signals becomes 1 GHz or greater, the influence of the skin effect where the currently flows only on the surface of the conductor becomes prominent, and the influence of the increase in impedance caused by changes in the current transmission path due to the irregularities of the surface can no longer be ignored. From this point also, the surface roughness of the copper foil is desirably low.

In order to meet the foregoing demands, numerous surface treatment methods have been proposed for use in a copper foil for a printed circuit board.

Although the surface treatment method differs with a rolled copper foil and an electrolytic copper foil, an example of a surface treatment method of an electrolytic copper foil is shown below.

Foremost, in order to increase the bond strength (peel strength) of the copper and the resin base material, generally speaking, particles formed from copper and copper oxide are provided on the copper foil surface (roughening treatment), and a heat-resistant layer (barrier layer) formed of brass, zinc or the like is formed to yield heat resistant properties.

Then, in order to prevent the surface oxidation and the like during the transportation or storage, corrosion prevention treatment such as chromate treatment based on immersion or electrolytic zinc, electrolytic zinc chromate treatment or the like is ultimately performed to obtain a product.

Among the above, in particular, the surface treatment method of forming a heat-resistant layer is a major key in deciding the surface properties of the copper foil. Thus, as the metal or alloy forming the heat-resistant layer, numerous copper foils forming a film layer of Zn, Cu—Ni alloy, Cu—Co alloy, Cu—Zn alloy and the like have been put into practical use (for instance, refer to Patent Document 1).

Among the above, a copper foil formed with a heat-resistant layer formed from Cu—Zn alloy (brass) is broadly used industrially since it yields superior characteristics such as no spots on the resin layer when used as a printed circuit board formed from epoxy resin or the like, and less deterioration in the peel strength of the copper foil after the printed circuit board is retained at a high temperature. Patent Document 2 provides a detailed description regarding the method of forming such a heat-resistant layer formed from brass.

In recent years, in the manufacturing processing of a printed circuit board; in particular a package substrate, the processing of roughening the copper foil gloss surface is being performed based on soft etching using mixed solution of sulfuric acid and hydrogen peroxide in order to improve the adhesion of the resist or buildup resin substrate and the gloss surface of the copper foil as the circuit side.

Nevertheless, when the foregoing soft etching using mixed solution of sulfuric acid and hydrogen peroxide is performed to the copper foil circuit gloss surface of a printed circuit board using a copper foil formed with a heat-resistant layer formed from brass, the corrosion (circuit corrosion) phenomenon of both ends (edges) of the previously formed circuit pattern will occur, and there is a problem in that the peel strength with the resin base material will deteriorate.

The circuit corrosion phenomenon is a phenomenon where the adhesive boundary layer between the copper foil circuit and the resin base material; that is, the circuit side surface where the heat-resistant layer formed from brass is exposed will erode due to mixed solution of sulfuric acid and hydrogen peroxide, whereby the roughened surface side in the vicinity of the edge portion of the circuit which should normally be a yellow color (caused by brass) becomes red, and the peel strength of the copper foil of that portion will deteriorate considerably. If this phenomenon occurs on the entire surface of the circuit pattern, the circuit pattern will peel from the base material and cause a major problem.

[Patent Document 1] Japanese Patent Application (Kokoku) Publication No. S51-35711

[Patent Document 2] Japanese Patent Application (Kokoku) Publication No. S 54-6701

SUMMARY OF THE INVENTION

Thus, an object of the present invention is to develop a copper foil suitable for use in a semiconductor package substrate capable of increasing, without deteriorating the other various characteristics, the normal peel strength of the copper foil of a printed circuit board that was produced by laminating a copper foil and a resin base material, and the peel strength (hereinafter referred to as the "heat-resistant peel strength") after the printed circuit board was retained at a high temperature for a given period of time, and to additionally reduce the foregoing circuit corrosion phenomenon. In particular, an object of the present invention is to establish surface treatment technology of a copper foil capable of considerably improving the heat-resistant peel strength by laminating a copper foil on a resin base material, and effectively preventing the circuit corrosion phenomenon in cases of using a sulfuric acid hydrogen peroxide etching solution to perform soft etching to the circuit.

In order to achieve the foregoing object, as a result of intense study regarding the conditions of performing surface treatment to the copper foil, the present inventors discovered that the corrosion resistivity (circuit corrosion resistivity) of the roughened surface on the opposite side of the copper foil is effective in improving the heat-resistant peel strength of the copper foil and the resistivity of sulfuric acid and hydrogen peroxide; that is, the resistivity during the soft etching of the copper foil gloss surface using mixed solution of sulfuric acid and hydrogen peroxide.

Based on the foregoing discovery, the present invention provides:

1) A copper foil for a printed circuit board comprising a nickel-zinc layer including nickel, zinc, a compound of nickel and zinc on a roughened surface of a copper foil, and a chromate film layer on the nickel zinc layer, wherein the zinc add-on weight per unit area of the nickel zinc layer is 180 µg/dm$^2$ or more and 3500 µg/dm$^2$ or less, and the nickel weight ratio in the nickel zinc layer {nickel add-on weight/ (nickel add-on weight+zinc add-on weight)} is 0.38 or more and 0.7 or less;

2) The copper foil for a printed circuit board according to paragraph 1) above, wherein the {nickel add-on weight/ (nickel add-on weight+zinc add-on weight)} is 0.4 or more and 0.55 or less;

3) The copper foil for a printed circuit board according to paragraph 1) or paragraph 2) above, wherein the chromium add-on weight per unit area of the copper foil of the chromate film layer is 30 µg/dm$^2$ or more and 100 µg/dm$^2$ or less;

4) The copper foil for a printed circuit board according to any one of paragraphs 1) to 3) above, wherein, among all zinc included in the nickel zinc layer, 45 to 90% of zinc existing as zinc oxide or zinc hydroxide is contained therein;

5) The copper foil for a printed circuit board according to any one of paragraphs 1) to 3) above, wherein, among all nickel included the nickel zinc layer, 60 to 80% of nickel existing as nickel oxide or nickel hydroxide is contained therein;

6) The copper foil for a printed circuit board according to any one of paragraphs 1) to 5) above, further comprising a silane coupling agent layer on the chromate layer;

7) The copper foil for a printed circuit board according to any one of paragraphs 1) to 6) above, wherein the copper foil is an electrolytic copper foil, and the roughened surface is a rough face obtained during electrolytic plating, a face obtained by additionally performing roughening treatment to the rough face, or a face obtained by performing roughening treatment on a gloss surface of an electrolytic copper foil;

8) The copper foil for a printed circuit board according to any one of paragraphs 1) to 6) above, wherein the copper foil is a rolled copper foil, and the roughened surface is a face obtained by performing roughening treatment to the rolled copper foil; and 9) A copper clad laminate for a printed circuit board produced by laminating the copper foil for a printed circuit board according to any one of paragraphs 1) to 8) above, and a resin for a printed circuit board.

As described above, the copper foil for a printed circuit board of the present invention uses a nickel zinc layer in order to prevent the deterioration in the peel strength of the copper foil after retaining the printed circuit board at a high temperature, and does not use a heat-resistant layer formed from brass, which was conventionally considered to be indispensible.

Consequently, it is possible to dramatically improve the heat-resistant peel strength of the copper foil. It is further possible to effectively prevent the circuit corrosion phenomenon caused by chemicals, and in particular new characteristics of being able to improve the resistivity to sulfuric acid hydrogen peroxide. Thus, the present invention is extremely useful as a copper foil for a printed circuit board (in particular, a copper foil for a semiconductor package substrate) and a copper clad laminate (in particular, a copper clad laminate for a semiconductor package substrate) produced by laminating a copper foil and a resin base material. Needless to say, the present invention can also be used as a general copper foil for a printed circuit board.

DETAILED DESCRIPTION OF THE INVENTION

The present invention is now explained specifically and in detail in order to facilitate the understanding thereof.

As the copper foil of the present invention, both an electrolytic copper foil and a rolled copper foil can be used. In the case of an electrolytic copper foil, the rough face obtained during the electrolytic plating can be used. Moreover, roughening treatment may be additionally performed to the foregoing rough face. For example, in order to increase the peel strength of the copper foil after its lamination with the resin base material, an electrolytic copper foil subject to roughening treatment of performing electrodeposition of copper in a "knobbed" shaped to the degreased surface of the copper foil may be used as is.

Generally speaking, in a drum-shaped manufacturing apparatus of an electrolytic copper foil, one side (drum side) is a gloss surface and the other side is a rough face. With a rolled copper foil, both sides will be a glossy rolled surface. In the present invention, although the electrolytic copper foil has a rough face and a gloss surface, the rough face can be used as is. The gloss surface of the electrolytic copper foil is subject to roughening treatment in order to increase the peel strength and made into a roughened surface.

Roughening treatment is similarly performed to the rolled copper foil. Well-known roughening treatment may be used in the foregoing cases, and there is no particular limitation in the type of roughening treatment that may be performed.

The roughened surface of the present invention refers to the rough face that is obtained during the electrolytic plating of the electrolytic copper foil, and the roughened surface of the electrolytic copper foil or the rolled copper foil that was subject to roughening treatment, and can be applied to either copper foil.

Foremost, a brass film layer, which was conventionally considered to be indispensable, is not provided to the copper foil for a semiconductor package substrate. Conventionally, unless a brass film layer was provided, it was considered that characteristics would deteriorate; for instance, the peel strength (heat-resistant peel strength) of the copper foil after the printed circuit board was retained at a high temperature for a given period of time would deteriorate. As a substitute method, the present invention forms a nickel zinc layer in order to improve the heat-resistant peel strength. Accordingly, a significant feature of the present invention is that a brass film layer is not formed on the copper foil, which was conventionally considered a technical standard.

The nickel zinc layer is not a uniform nickel-zinc alloy, and includes nickel and zinc which are in an oxidized and/or hydroxidized state. For example, the nickel-zinc layer includes a surface oxide film or a surface hydroxide film.

As described above, the copper foil for a semiconductor package substrate of the present invention is configured from a nickel zinc layer formed on the roughened surface of the copper foil to become the adherend surface with the resin, a chromate film layer and, as needed, a silane coupling agent layer. As the copper foil, the foregoing rolled copper foil or the electrolytic copper foil can be used. As the chromate film layer, the electrolytic chromate film layer or the immersion chromate film layer can be used.

The present invention defines, as described above, the nickel-zinc layer including nickel, zinc, and a compound of nickel and zinc on a roughened surface of a copper foil, and the zinc add-on weight per unit area of the copper foil in the nickel zinc layer must be 180 $\mu g/dm^2$ or more and 3500 $\mu g/dm^2$ or less. If the zinc add-on weight is less than 180 $\mu g/dm^2$, the deterioration of the peel strength after the high-temperature heating will increase. Moreover, if the zinc add-on weight exceeds 3500 $\mu g/dm^2$, the corrosion of the circuit edge caused by the sulfuric acid hydrogen peroxide etching solution will become prominent.

The {nickel add-on weight/(nickel add-on weight+zinc add-on weight)} must be 0.38 or more and 0.7 or less. If it is less than 0.38, the circuit corrosion phenomenon cannot be effectively prevented. Moreover, if it exceeds 0.7, the heat-resistant peel strength will deteriorate.

The nickel zinc layer is normally formed under the following conditions. Nevertheless, so long as the electroplating conditions are able to achieve results where the zinc add-on weight per unit area of the nickel zinc layer is 180 $\mu g/dm^2$ or more and 3500 $\mu g/dm^2$ or less, and the {nickel add-on weight/(nickel add-on weight+zinc add-on weight)} is 0.38 or more and 0.7 or less, there is no particular limitation in the electroplating conditions and other electroplating conditions may also be used.

(Plating Solution Composition)
  Ni: 10 g/L to 30 g/L, Zn: 1 g/L to 15 g/L, sulfuric acid ($H_2SO_4$): 1 g/L to 12 g/L,
  And each of the above is used as the basic bath.
  Chloride ion: 1 g/L to 5 g/L is added as needed.
(Current density) 3 to 40 $A/dm^2$ Next, as the chromate treatment, in order to produce this chromate film layer, any chromate treatment among the electrolytic chromate treatment, immersion chromate treatment and zinc chromate treatment in which zinc is contained in the chromate bath may be used.

Regardless of the chromate treatment method, if the chromium add-on weight is less than 30 $\mu g/dm^2$, and the effect of increasing the acid resistivity and heat resistivity is insufficient. Thus, the chromium add-on weight is made to be 30 $\mu g/dm^2$ or more. Meanwhile, if the chromium add-on weight exceeds 100 $\mu g/dm^2$, the effect of the chromate treatment will become saturated and the chromium add-on weight will no longer increase. In summary, it could be said that the chromium add-on weight per unit area in the chromate treatment layer is desirably 30 to 100 $\mu g/dm^2$ Examples of conditions for forming the chromate film layer are shown below. However, as described above, the present invention is not limited to the following conditions, and any well-known chromate treatment may be used.

Generally speaking, in the case of the immersion chromate treatment, it is possible to achieve a chromium add-on weight per unit area of 30 to 40 $\mu g/dm^2$. Moreover, with the electrolytic chromate treatment, it is possible to achieve a chromium add-on weight per unit area of 30 to 100 $\mu g/dm^2$.

This corrosion prevention treatment is one factor that affects the acid resistivity and heat resistivity of the copper foil, and the chromate treatment is effective in improving the acid resistivity and heat resistivity of the copper foil.

(a) Example of immersion chromate treatment
  $CrO_3$ or $K_2Cr_2O_7$: 1 to 12 g/L, Zn $(OH)_2$ or $ZnSO_4.7H_2O$: 0 to 10 g/L, $Na_2SO_4$: 0 to 20 g/L, pH: 2.5 to 12.5, temperature: 20 to 60° C., time: 0.5 to 20 seconds (b) Example of electrolytic chromate treatment
  $CrO_3$ or $K_2Cr_2O_7$: 1 to 12 g/L, Zn $(OH)_2$ or $ZnSO_4.7H_2O$: 0 to 10 g/L, $Na_2SO_4$: 0 to 20 g/L, pH: 2.5 to 12.5, temperature: 20 to 60° C., current density: 0.5 to 5 A/dm2, time: 0.5 to 20 seconds As the silane coupling agent to be used in the copper foil for a printed circuit board of the present invention, it is desirable to include at least one type among, tetraalkoxysilane, and alkoxysilane comprising a functional group having reactivity with resin. Although the selection of this silane coupling agent is arbitrary, selection in consideration with the adhesiveness with resin is desirable.

Subsequently, the silane coupling agent treatment (drying after application) was performed on the corrosion-resistant layer.

Conditions of the silane coupling agent treatment are as follows.

An aqueous solution including epoxy silane at 0.2% by volume and TEOS (tetraethoxysilane) at 0.4% by volume was adjusted to pH 5, thereafter applied and dried.

[Test Method]
The printed circuit board that was obtained by laminating and bonding the copper foil that was produced as described above with the following resin base material was used to perform various tests, and the adhesion of the copper foil and the resin base material was evaluated and the plating add-on weight of nickel and zinc per unit area was measured. In addition, the abundance ratio of the 0-valent metal state and bivalent oxidized state of nickel and zinc contained in the nickel zinc layer was measured with XPS (X-ray photoelectron spectroscopy).

The following two types of resin base material to be laminated with the copper foil were used.

FR-4 resin (glass cloth base material epoxy resin)

BT resin (Bismaleimide-Triazine Resin, Trademark name: GHPL-802 manufactured by Mitsubishi Gas Chemical Co., Inc.)

Incidentally, the BT resin is a material that has high heat resistivity and is being used in a printed circuit board for a semiconductor package.

(1) Measurement of Normal Peel Strength and Heat-Resistant Peel Strength Using FR-4 Substrate Etching was performed to the copper foil formed on a laminate produced by laminating the face formed with a nickel zinc layer if the copper foil and the FR-4 resin base material, and a copper foil circuit having a width of 10 mm was formed on the laminate. The normal peel strength was measured by peeling this circuit. Subsequently, the laminate formed with the foregoing copper foil circuit having a width of 10 mm was heated in the atmosphere at 180° C. for 2 days. Then the peel strength after the heating (hereinafter referred to as the "heat-resistant peel strength") and relative deterioration rate (loss %) based on the normal peel strength was measured. In terms of heat resistivity, the FR-4 substrate is inferior to the BT substrate. Thus, if favorable heat-resistant peel strength and a low deterioration rate can be achieved when using the FR-4 substrate, sufficient heat-resistant peel strength and deterioration rate can also be achieve when using the BT substrate.

(2) Measurement of Normal Peel Strength and Resistivity to Sulfuric Acid and Hydrogen Peroxide Using BT Substrate Etching was performed to the copper foil formed on a laminate produced by laminating the face formed with a nickel zinc layer if the copper foil and the BT resin base material, and a copper foil circuit having a width of 0.4 mm was formed on the laminate. The normal peel strength was measured by peeling this circuit. Subsequently, the laminate formed with the foregoing copper foil circuit having a width of 0.4 mm was used to perform the test of the resistivity to sulfuric acid hydrogen peroxide.

In this test, the copper foil circuit on the laminate was immersed in an etching solution including 100 to 400 g/L of sulfuric acid 100 to 400 g/L and 10 to 60 g/L of hydrogen peroxide to etch the copper foil circuit to have a thickness of 2 μm, and the relative deterioration rate (loss %) was thereafter measured from the foregoing peel strength and the normal peel strength.

It could be said that the measurement of the peel strength in the foregoing case was conducted under a harsh environment, and the conditions when using the FR-4 substrate are more severe in comparison to the evaluation of chemical resistivity that is generally conducted. Accordingly, if favorable resistivity to sulfuric acid and hydrogen peroxide can be achieved when using the BT substrate, sufficient chemical resistivity (in particular, that resistivity to sulfuric acid hydrogen peroxide) can also be achieved with the FR-4 substrate.

(3) Measurement of Plating Add-on Weight of Nickel and Zinc Per Unit Area

A laminate was produced by laminating the face formed with a nickel zinc layer of the copper foil with the FR-4 resin base material so that the nickel zinc layer is exposed on the surface. Subsequently, the nickel zinc layer that is exposed on the laminate surface and the copper as its mother layer were dissolved in hydrochloric acid or nitric acid, and the add-on weight of nickel and zinc per unit area was measured by performing a chemical analysis of the nickel and zinc concentration in the solution.

(4) Analysis of Metal/Oxidized State of Zinc and Nickel

The abundance ratio of the 0-valent metal state and bivalent oxidized state of nickel and zinc contained in the nickel zinc layer was measured with XPS (X-ray photoelectron spectroscopy). The measurement was conducted intermittently from the outermost layer to the copper layer as the substrate of the nickel zinc layer while etching the copper foil thickness based argon ion sputtering, and the average abundance ratio of the nickel oxide and zinc oxide (both including hydroxide) in the overall nickel zinc layer was calculated by integrating the abundance ratio of nickel and zinc in an oxidized state obtained in the respective depths with the depth from the outermost surface.

AXIS-HS manufactured by KRATOS was used as the measuring equipment, and the output of the argon ion sputtering was 52.5 W. Under these conditions, the copper foil thickness is etched approximately 20 Å per minute. The sputtering time was 15 to 100 minutes.

EXAMPLES

The Examples and Comparative Examples of the present invention are now explained. The results thereof are shown in the respective tables below. These Examples are merely illustrative, and the present invention shall in no way be limited thereby. In other words, various modifications and other embodiments based on the technical spirit claimed in the claims shall be included in the present invention as a matter of course.

The Comparative Examples are indicated for comparison with the present invention.

Examples 1 to 7

Comparative Examples 1 and 2

An electrolytic copper foil having a thickness of 12 μm was used, and a nickel zinc layer was formed on a roughened surface (surface average roughness: 3.8 μm) of the copper foil via electroplating according to the following conditions. The plating add-on weight of nickel and zinc per unit area and the nickel weight ratio in the plating film are shown in Table 1.

(Electroplating solution composition) Ni: 13 g/L, Zn: 5 g/L, sulfuric acid ($H_2SO_4$): 8.5 g/L (Current density) 20 A/dm$^2$ (Plating time) 0.5 to 10 seconds Chromate treatment was performed to form a corrosion-resistant layer on the nickel zinc layer additionally. The treatment conditions are shown below.

$CrO_3$: 4.0 g/L, $ZnSO_4 \cdot 7H_2O$: 2.0 g/L, $Na_2SO_4$: 15 g/L, pH: 4.2, temperature: 45° C., current density: 3.0 A/dm$^2$, time: 1.5 seconds

TABLE 1

|  | Ni—Zn Plating Current Density A/dm2 | Plating Add-on Weight | | | FR-4 Substrate Properties | | | BT Substrate Properties | | |
|---|---|---|---|---|---|---|---|---|---|---|
|  |  | Ni Deposition Weight μg/dm2 | Zn Deposition Weight μg/dm2 | Ni Weight Ratio | Normal Peel Strength kN/m | Heat-Resistant Peel Strength | | | After Sulfuric Acid and Hydrogen Peroxide Solution Treatment | |
|  |  |  |  |  |  | kN/m | Relative Deterioration Rate (%) | Normal Peel Strength kN/m | Relative Peel kN/m | Deterioration Rate (%) |
| Example 1 | 20 | 128 | 194 | 0.40 | 1.57 | 1.49 | 5 | 1.20 | 1.08 | 10 |
| Example 2 | 20 | 252 | 313 | 0.45 | 1.57 | 1.50 | 5 | 1.24 | 1.09 | 12 |
| Example 3 | 20 | 476 | 581 | 0.45 | 1.53 | 1.45 | 5 | 1.04 | 0.93 | 11 |
| Example 4 | 20 | 682 | 628 | 0.52 | 1.53 | 1.55 | −1 | 1.04 | 0.93 | 11 |
| Example 5 | 20 | 998 | 1292 | 0.44 | 1.59 | 1.52 | 5 | 1.21 | 1.07 | 12 |
| Example 6 | 20 | 1599 | 2058 | 0.44 | 1.68 | 1.59 | 5 | 1.18 | 1.03 | 13 |
| Example 7 | 20 | 1981 | 3381 | 0.38 | 1.64 | 1.65 | −1 | 1.04 | 0.91 | 13 |
| Comparative Example 1 | 20 | 124 | 159 | 0.44 | 1.51 | 0.69 | 54 | 1.01 | 0.96 | 5 |
| Comparative Example 2 | 20 | 2395 | 3909 | 0.38 | 1.67 | 1.67 | 0 | 1.10 | 0.93 | 16 |

The plating add-on weight will change depending on the plating time since the current density is constant (20 A/dm$^2$). The plating time of the treatment was within the range of 0.5 to 10 seconds. The zinc add-on weight per unit area was 194 to 3381 μg/dm$^2$, and the nickel weight ratio in the plating film was 37 to 52 wt %. All of these conditions fall within the scope of the present invention.

With the FR-4 substrate, the normal peel strength was 1.53 to 1.68 kN/m, the heat-resistant peel strength was 1.45 to 1.65 kN/m, and the deterioration rate was within a range of 5% or less, and all cases showed favorable normal peel strength and heat-resistant peel strength. Meanwhile, with the BT substrate, the normal peel strength was within the range of 1.04 to 1.24 kN/m. The peel strength after treatment with mixed solution of sulfuric acid and hydrogen peroxide was 0.91 to 1.09 kN/m, and the deterioration rate was 10 to 13%, and showed favorable properties.

Nevertheless, with Comparative Example 1, the zinc add-on weight per unit area was 159 μg/dm$^2$, and deviated from the present invention. In Comparative Example 1, with the FR-4 substrate, the normal peel strength was 1.51 kN/m, the heat-resistant peel strength was 0.69 kN/m, and the deterioration rate was 54%, and the heat-resistant peel strength deteriorated considerably.

Meanwhile, in Comparative Example 2, the zinc add-on amount was 3909 μg/dm$^2$, and deviated from the present invention. In Comparative Example 2, with the BT substrate (under a harsh environment), the normal peel strength was 1.10 kN/m, the peel strength after the treatment with mixed solution of sulfuric acid and hydrogen peroxide was 0.93 kN/m, and the deterioration rate was 16%, and possesses necessary and sufficient properties. Nevertheless, since the Ni add-on weight will increase, the Ni will not be etched and remain during the formation of the copper foil circuit, thereby causing a circuit fault. Thus, this is inappropriate as the surface treatment of a copper foil for a printed circuit board, and Comparative Example 2 deviates from the present invention.

As described above, Examples 1 to 7 showed favorable peel strength and heat-resistant peel strength with the FR-4 substrate, and showed favorable chemical resistivity in resistivity test of sulfuric acid and hydrogen peroxide with the BT substrate. Accordingly, it is easy to understand that these Examples have less deterioration in the peel strength after high-temperature heating, and possess effective characteristics that are able to considerably improve the circuit corrosion phenomenon.

In particular, it is possible to obtain surface treatment technology of a copper foil capable of effectively preventing the circuit corrosion phenomenon in cases of laminating a copper foil on a resin base material and using a sulfuric acid hydrogen peroxide etching solution to perform soft etching to the circuit.

Examples 8 to 13

A nickel zinc layer was formed under the following conditions by changing the current density. The plating add-on weight of nickel and zinc per unit area and the nickel weight ratio in the plating film are shown in Table 2.

(Current density) 3 to 40 A/dm$^2$ (Plating time) 0.5 to 10 seconds

The manufacturing conditions other than the current density were the same as Examples 1 to 7. The type of substrate and the measurement of peel strength were the same conditions as Examples 1 to 7. The results are similarly shown in Table 2.

TABLE 2

| | Ni—Zn Plating Current Density A/dm2 | Plating Add-on Weight | | | FR-4 Substrate Properties | | | BT Substrate Properties | | |
|---|---|---|---|---|---|---|---|---|---|---|
| | | Ni Deposition Weight μg/dm2 | Zn Deposition Weight μg/dm2 | Ni Weight Ratio | Normal Peel Strength kN/m | Heat-Resistant Peel Strength | | Normal Peel Strength kN/m | After Sulfuric Acid and Hydrogen Peroxide Solution Treatment | |
| | | | | | | kN/m | Relative Deterioration Rate (%) | | Normal Peel kN/m | Relative Deterioration Rate (%) |
| Example 8 | 3 | 590 | 724 | 0.45 | 1.50 | 1.52 | −2 | 0.92 | 0.88 | 4 |
| Example 9 | 5 | 246 | 330 | 0.43 | 1.56 | 1.45 | 7 | 0.98 | 0.91 | 8 |
| Example 10 | 10 | 372 | 411 | 0.48 | 1.50 | 1.45 | 4 | 1.03 | 0.94 | 8 |
| Example 11 | 15 | 436 | 438 | 0.50 | 1.48 | 1.40 | 6 | 1.03 | 0.98 | 5 |
| Example 12 | 25 | 641 | 588 | 0.52 | 1.48 | 1.50 | −1 | 1.04 | 0.93 | 11 |
| Example 13 | 40 | 359 | 367 | 0.49 | 1.51 | 1.47 | 2 | 0.98 | 0.96 | 3 |

With respect to the plating add-on weight, as shown in Table 2, the zinc add-on weight per unit area was 330 to 724 μg/dm$^2$, and the nickel weight ratio in the plating film was 43 to 52 wt %. All of these conditions fall within the scope of the present invention.

Since the nickel zinc layer cannot be created if the current density falls below 3 A/dm$^2$, this would be inappropriate as the plating condition of the nickel zinc layer of the present invention. If the current density exceeds 40 A/dm$^2$, since much hydrogen will be generated in the cathode (copper foil) and the current efficiency deteriorate enormously, this would be inappropriate as the treatment condition of the nickel zinc layer. Accordingly, the current density upon creating the nickel zinc layer of the present invention is preferably 3 to 40 A/dm$^2$.

With the FR-4 substrate, the normal peel strength was 1.48 to 1.56 kN/m, the heat-resistant peel strength was 1.40 to 1.52 kN/m, and the deterioration rate was within a range of 7% or less, and all cases showed favorable normal peel strength and heat-resistant peel strength.

Meanwhile, with the BT substrate, the normal peel strength was 0.92 to 1.04 kN/m, the peel strength after treatment with mixed solution of sulfuric acid and hydrogen peroxide was 0.88 to 0.98 kN/m, and the deterioration rate was 3 to 11%, and showed favorable properties.

As described above, Examples 8 to 13 showed favorable peel strength and heat-resistant peel strength with the FR-4 substrate, and showed favorable chemical resistivity in resistivity test of the sulfuric acid and hydrogen peroxide with the BT substrate. Accordingly, it is easy to understand that these Examples have less deterioration in the peel strength after high-temperature heating, and possess effective characteristics that are able to considerably improve the circuit corrosion phenomenon.

Examples 1, 7 and 14

Comparative Examples 3 and 4

The range of the Ni weight ratio in the plating film is now explained. As an example, Examples 1, 7 and 14 and Comparative Examples 3 and 4 are shown in Table 3. In addition, the plating add-on weight of nickel and zinc per unit area and the nickel weight ratio in the plating film are shown in Table 3.

The manufacturing conditions other than the above were the same as Examples 1 to 13. The type of substrate and the measurement of peel strength were also the same as Examples 1 to 13. The results are similarly shown in Table 3. The Ni weight ratio in the plating film was 0.38 to 0.54.

With the FR-4 substrate, the normal peel strength was 1.54 to 1.64 kN/m, the heat-resistant peel strength was 1.42 to 1.65 kN/m, and the deterioration rate was within a range of 8% or less, and all cases showed favorable normal peel strength and heat-resistant peel strength.

TABLE 3

| | Ni—Zn Plating Current Density A/dm2 | Plating Add-on Weight | | | FR-4 Substrate Properties | | | BT Substrate Properties | | |
|---|---|---|---|---|---|---|---|---|---|---|
| | | Ni Deposition Weight μg/dm2 | Zn Deposition Weight μg/dm2 | Ni Weight Ratio | Normal Peel Strength kN/m | Heat-Resistant Peel Strength | | Normal Peel Strength kN/m | After Sulfuric Acid and Hydrogen Peroxide Solution Treatment | |
| | | | | | | kN/m | Relative Deterioration Rate (%) | | Normal Peel kN/m | Relative Deterioration Rate (%) |
| Example 7 | 20 | 1981 | 3381 | 0.38 | 1.64 | 1.65 | −1 | 1.04 | 0.91 | 13 |
| Example 1 | 20 | 128 | 194 | 0.40 | 1.57 | 1.49 | 5 | 1.20 | 1.08 | 10 |
| Example 14 | 25 | 725 | 619 | 0.54 | 1.54 | 1.42 | 8 | 1.07 | 0.91 | 15 |
| Comparative Example 3 | 20 | 120 | 206 | 0.37 | 1.39 | 0.97 | 30 | 1.12 | 0.91 | 19 |
| Comparative Example 4 | 40 | 745 | 233 | 0.76 | 1.50 | 1.02 | 32 | 1.01 | 0.92 | 9 |

Meanwhile, with the BT substrate, the normal peel strength was 1.04 to 1.20 kN/m, the peel strength after treatment with mixed solution of sulfuric acid and hydrogen peroxide was 0.91 to 1.08 gN/m, and the deterioration rate was 13 to 15%, and showed favorable properties.

Nevertheless, with Comparative Example 3, the Ni weight ratio was 0.37, and deviated from the present invention. In Comparative Example 3, with the FR-4 substrate, the normal peel strength was 1.39 kN/m, the heat-resistant peel strength was 0.97 kN/m, and the deterioration rate was 30%, and the heat-resistant peel strength deteriorated considerably.

Meanwhile, with Comparative Example 4, the Ni weight ratio was 0.76, and deviated from the present invention. In Comparative Example 4, with the FR-4 substrate, the normal peel strength was 1.50 kN/m, the heat-resistant peel strength was 1.02 kN/m, and the deterioration rate was 32%, and, as with Comparative Example 3, the heat-resistant peel strength deteriorated considerably.

Accordingly, the Ni weight ratio in the plating film is preferably within a range of 0.38 to 0.70, and more preferably within a range of 0.40 to 0.54.

Examples 15 to 19

The nickel zinc layer was formed upon changing the plating bath composition under the following conditions. The plating add-on weight of nickel and zinc per unit area and the nickel weight ratio in the plating film are shown in Table 4. Here, the difference in comparison to Examples 1 to 14 is that the component composition of the plating bath was changed.

The component composition of the plating bath in Examples 15 to 19 is shown below.
(Plating solution composition of Example 15) Ni: 10 g/L, Zn: 1 g/L, sulfuric acid ($H_2SO_4$): 8.5 g/L
(Plating solution composition of Example 16) Ni: 20 g/L, Zn: 8 g/L, sulfuric acid ($H_2SO_4$): 1 g/L
(Plating solution composition of Example 17) Ni: 25 g/L, Zn: 12 g/L, sulfuric acid ($H_2SO_4$): 12 g/L
(Plating solution composition of Example 18) Ni: 30 g/L, Zn: 15 g/L, sulfuric acid ($H_2SO_4$): 8.5 g/L
(Plating solution composition of Example 19) Ni: 10 g/L, Zn: 1 g/L, sulfuric acid ($H_2SO_4$): 6 g/L, chloride ion: 5 g/L
(Current density) 20 to 25 A/dm$^2$
(Plating time) 1 to 8 seconds The manufacturing conditions other than the above were the same as Examples 1 to 7. The type of substrate and the measurement of peel strength were also the same as Examples 1 to 7. The results are similarly shown in Table 4.

The zinc add-on weight per unit area was 320 to 817 μg/dm$^2$, and the nickel weight ratio in the plating film was 44 to 50 wt %. All of these conditions fall within the scope of the present invention.

With the FR-4 substrate, the normal peel strength was 1.52 to 1.62 kN/m, the heat-resistant peel strength was 1.47 to 1.59 kN/m, and the deterioration rate was within a range of 7% or less, and all cases showed favorable normal peel strength and heat-resistant peel strength.

Meanwhile, with the BT substrate, the normal peel strength was 0.98 to 1.09 kN/m, the peel strength after treatment with mixed solution of sulfuric acid and hydrogen peroxide was 0.89 to 0.97 kN/m, and the deterioration rate was 8 to 17%, and showed favorable properties.

As described above, Examples 15 to 19 showed favorable peel strength and heat-resistant peel strength with the FR-4 substrate, and showed favorable chemical resistivity in test of resistivity to the sulfuric acid and hydrogen peroxide with the BT substrate. Accordingly, it is easy to understand that these Examples have less deterioration in the peel strength after high-temperature heating, and possess effective characteristics that enable to considerably improve the circuit corrosion phenomenon.

As described above, the plating bath conditions upon producing the nickel zinc layer of the present invention are preferably as follows: nickel concentration: 10 to 30 g/L, zinc concentration: 1 to 15 g/L, sulfuric acid concentration: 1 to 12 g/L, and chloride ion: 0 to 5 g/L. If the concentration deviates from the foregoing range and the concentration of nickel or zinc becomes high, this would not be desirable as a plating bath condition since it will interfere with the wastewater treatment. Moreover, if the component concentration becomes low and deviates from the foregoing range, in addition to the management of the plating bath becoming difficult to factors such as changes in the concentration caused by the plating, the current efficiency will deteriorate enormously, and this is undesirable as a plating bath condition.

Examples 20 to 22

Examples in cases where the method of chromate treatment is changed are now explained.

In these Examples, the nickel zinc layer was formed under the same conditions as shown in Examples 1 to 7. The same conditions for the current density and the plating time (current density 20 A/dm2, plating time 1.8 seconds) were used

TABLE 4

| | Ni—Zn Plating Current Density A/dm2 | Plating Add-on Weight | | | FR-4 Substrate Properties | | | BT Substrate Properties | | |
|---|---|---|---|---|---|---|---|---|---|---|
| | | Ni Deposition Weight μg/dm2 | Zn Deposition Weight μg/dm2 | Ni Weight Ratio | Normal Peel Strength kN/m | Heat-Resistant Peel Strength kN/m | Relative Deterioration Rate (%) | Normal Peel Strength kN/m | After Sulfuric Acid and Hydrogen Peroxide Solution Treatment kN/m | Relative Deterioration Rate (%) |
| Example 15 | 25 | 318 | 320 | 0.50 | 1.57 | 1.50 | 5 | 1.09 | 0.91 | 17 |
| Example 16 | 20 | 381 | 463 | 0.45 | 1.62 | 1.59 | 2 | 0.98 | 0.89 | 9 |
| Example 17 | 20 | 668 | 817 | 0.45 | 1.52 | 1.56 | −2 | 0.98 | 0.91 | 8 |
| Example 18 | 20 | 637 | 807 | 0.44 | 1.59 | 1.57 | 2 | 1.09 | 0.97 | 11 |
| Example 19 | 20 | 425 | 467 | 0.48 | 1.58 | 1.47 | 7 | 1.04 | 0.96 | 8 | for comparison. The plating add-on weight of nickel and zinc per unit area and the nickel weight ratio in the plating film are shown in Table 5.

Here, the difference in comparison to Examples 1 to 7 is that the conditions of the chromate treatment were changed. In Examples 1 to 7, electrolytic zinc chromate treatment was performed. The conditions of the chromate treatment in Examples 20 to 22 were as follows.

(Chromate treatment of Example 20) This is electrolytic chromate treatment in which the chromate bath does not contain zinc.

$CrO_3$: 6.0 g/L, pH: 10.0, temperature: 25 C, current density: 2 A/dm$^2$, time: 2 seconds (Chromate treatment of Example 21) This is electrolytic zinc chromate treatment.

$CrO_3$: 1.5 g/L, $ZnSO_4.7H_2O$: 1.0 g/L, $Na_2SO_4$: 10 g/L, pH: 4.5, temperature: 50° C., current density: 1.5 A/dm$^2$, time: 2 seconds (Chromate treatment of Example 22) This is immersion zinc chromate treatment.

$CrO_3$: 3.5 g/L, $ZnSO_4.7H_2O$: 2.4 g/L, $Na_2SO_4$: 15 g/L, pH: 4.2, temperature: 40° C., time: 10 seconds The type of substrate and the measurement of peel strength were also the same as Examples 1 to 7. The results are similarly shown in Table 5.

nickel zinc layer of the present invention formed thereon will not be affected by the type of chromate treatment, various types of chromate treatment can be applied as the corrosion prevention treatment.

As a result of the foregoing Examples and Comparative Examples, it is possible to understand that, with the present invention, hardly any corrosion due to the sulfuric acid hydrogen peroxide solution will occur on the roughened surface, and the deterioration in the peel strength after the high-temperature heating is less. Thus, the present invention is able to considerably improve the circuit corrosion phenomenon without deteriorating the characteristics of a conventional heat-resistant treatment layer formed from brass.

The chemical state of nickel and zinc contained in the nickel zinc layer of the present invention is now explained.

With a standard alloy plating film, the metal elements composing the film are alloyed, and only a small portion of the metal elements existing on the outermost layer come in contact with the atmosphere and become an oxidized state.

Nevertheless, according to the XPS measurement results, the nickel-zinc layer of the present invention does contain not only nickel zinc alloy itself but also a structure wherein nickel and zinc of a 0-valent state (metal) and of a bivalent state (oxide and/or hydroxide) coexist in a surface layer ranging from the outermost surface of the treated copper foil to the

TABLE 5

| | Ni—Zn Plating Current Density A/dm2 | Plating Add-on Weight | | | FR-4 Substrate Properties | | | BT Substrate Properties | | |
|---|---|---|---|---|---|---|---|---|---|---|
| | | Ni Deposition Weight μg/dm2 | Zn Depositiion Weight μg/dm2 | Ni Weight Ratio | Normal Peel Strength kN/m | Heat-Resistant Peel Strength | | Normal Peel Strength kN/m | After Sulfuric Acid and Hydrogen Peroxide Solution Treatment | |
| | | | | | | kN/m | Relative Deterioration Rate (%) | | Normal Peel kN/m | Relative Deterioration Rate (%) |
| Example 20 | 20 | 329 | 434 | 0.43 | 1.51 | 1.47 | 3 | 1.03 | 0.94 | 8 |
| Example 21 | 20 | 461 | 552 | 0.46 | 1.54 | 1.50 | 3 | 1.01 | 0.83 | 17 |
| Example 22 | 20 | 312 | 347 | 0.47 | 1.48 | 1.43 | 3 | 1.08 | 0.98 | 9 |

As shown in Table 5, with Examples 20 to 22, the zinc add-on amount was 347 to 552 μg/dm$^2$, and the Ni ratio was 43 to 47 wt %. All of these conditions fall within the scope of the present invention. With the FR-4 substrate, the normal peel strength was 1.48 to 1.54 kN/m, the heat-resistant peel strength was 1.43 to 1.50 kN/m, and the deterioration rate was within a range of 3% or less, and all cases showed favorable peel strength.

Meanwhile, with the BT substrate, the normal peel strength was 1.01 to 1.08 kN/m, the peel strength after treatment with mixed solution of sulfuric acid and hydrogen peroxide was 0.83 to 0.98 kN/m, and the deterioration rate was 8 to 17%, and showed favorable properties.

As described above, Examples 20 to 22 showed favorable peel strength and heat resistivity with the FR-4 substrate, and showed favorable chemical resistivity in resistivity test to the sulfuric acid and hydrogen peroxide with the BT substrate. Accordingly, it is easy to understand that these Examples have less deterioration in the peel strength after high-temperature heating, and possess effective characteristics that are able to considerably improve the circuit corrosion phenomenon as a result of selecting the substrate and selecting the etching solution.

As evident from Examples 20 to 22, since the heat resistivity and chemical resistivity of the copper foil with the surface of the copper substrate. For instance, in Example 14, among all nickel atoms in the film, those taking a chemical state of oxide or hydroxide account for 55%, and, among all zinc atoms in the film, those taking a bivalent chemical state account for 72%.

With the nickel zinc layer obtained by the surface treatment of the present invention, it has been confirmed that, among all zinc in the film, the ratio of those taking a chemical state of oxide or hydroxide is within a range of 45 to 90%, and, similarly, among all nickel in the film, the ratio of those taking a chemical state of oxide or hydroxide is within a range of 60 to 80%. As shown in the Examples, it has been confirmed that the intended characteristics and effects are obtained in the foregoing conditions. The present invention covers all of the foregoing conditions.

Although a case of applying the present invention to the roughened surface of an electrolytic copper foil was described above, it goes without saying that the present invention can also be similarly applied to an electrolytic copper foil obtained by performing roughening treatment to a gloss surface. In addition, the same goes for applying the present invention to a rolled copper foil that further was subject to roughening treatment. So as long as a roughened surface of an electrolytic copper foil and a rolled copper foil is used, although there will be some difference in the absolute value of the normal peel strength due to the shape of the roughening treatment and differences in the surface roughness, it is possible to reduce the relative deterioration rate from the normal peel of the heat-resistant peel strength and the peel strength after the sulfuric acid hydrogen peroxide treatment.

The central objective of the copper foil for a printed circuit board of the present invention is to select the optimal conditions of the nickel zinc layer. Consequently, it will be possible to dramatically improve the heat-resistant peel strength of the copper foil, effectively prevent the circuit corrosion phenomenon, and constantly and stably exhibit the effect in resistivity to sulfuric acid and hydrogen peroxide.

Accordingly, it should be easy to understand that the selection of the electrolytic copper foil and the rolled copper foil or the selection of the roughened surface can be made arbitrarily according to the intended purpose.

As described above, the copper foil for a printed circuit board of the present invention uses a nickel zinc layer in order to prevent the deterioration in the peel strength with resin after high-temperature heating, and is thereby able to dramatically improve the heat-resistant peel strength of the copper foil. In addition, the circuit corrosion phenomenon can also be effectively prevented, and the new characteristics of being able to constantly and stably exhibit the effect in resistivity to sulfuric acid and hydrogen peroxide are realized. While finer patterning and higher frequency of the printed circuit are making progress in recent years, the present invention is extremely useful as a copper foil for a printed circuit board (in particular, a copper foil for a semiconductor package substrate) and a copper clad laminate (in particular, a copper clad laminate for a semiconductor package substrate) produced by laminating a copper foil and a resin base material.

The invention claimed is:

1. A copper foil for a printed circuit board comprising a nickel-zinc layer including nickel, zinc, at least one of an oxide and a hydroxide of nickel, and at least one of an oxide and a hydroxide of zinc on a roughened surface of a copper foil, and a chromate film layer on the nickel-zinc layer, wherein a zinc add-on weight per unit area of the copper foil in the nickel zinc layer is 180 µg/dm$^2$ or more and 3500 µg/dm$^2$ or less, and a nickel weight ratio in the nickel-zinc layer {nickel add-on weight per unit area/(nickel add-on weight per unit area+zinc add-on weight per unit area)} is 0.38 or more and 0.70 or less, and wherein, among all zinc included in the nickel-zinc layer, 45 to 90% exists therein as zinc oxide or zinc hydroxide.

2. The copper foil for a printed circuit board according to claim 1, wherein the {nickel add-on weight per unit area/(nickel add-on weight per unit area+zinc add-on weight per unit area)} is 0.40 or more and 0.55 or less.

3. The copper foil for a printed circuit board according to claim 1, wherein a chromium add-on weight of the chromate film layer per unit area of the copper foil is 30 µg/dm$^2$ or more and 100 µg/dm$^2$ or less.

4. The copper foil for a printed circuit board according to claim 1, wherein, among all nickel atoms included in the nickel-zinc layer, 60 to 80% are existing therein as nickel oxide or nickel hydroxide.

5. The copper foil for a printed circuit board according to claim 1, further comprising a silane coupling agent layer on the chromate film layer.

6. The copper foil for a printed circuit board according to claim 1, wherein the copper foil is an electrolytic copper foil, and the roughened surface is a rough face obtained during electrolytic plating, a face obtained by additionally performing roughening treatment to the rough face, or a face obtained by performing roughening treatment on a gloss surface of an electrolytic copper foil.

7. The copper foil for a printed circuit board according to claim 1, wherein the copper foil is a rolled copper foil and the roughened surface is a face obtained by performing roughening treatment to the rolled copper foil.

8. A copper clad laminate for a printed circuit board produced by laminating the copper foil for a printed circuit board according to claim 1, and a resin for a printed circuit board.

9. A copper foil for a printed circuit board comprising a nickel-zinc layer including nickel, zinc, at least one of an oxide and a hydroxide of nickel, and at least one of an oxide and a hydroxide of zinc on a roughened surface of a copper foil, and a chromate film layer on the nickel-zinc layer, wherein a zinc add-on weight per unit area of the copper foil in the nickel zinc layer is 180 µg/dm$^2$ or more and 3500 µg/dm$^2$ or less, and a nickel weight ratio in the nickel-zinc layer {nickel add-on weight per unit area/(nickel add-on weight per unit area+zinc add-on weight per unit area)} is 0.38 or more and 0.70 or less, and wherein, among all nickel included in the nickel-zinc layer, 60 to 80% exists therein as nickel oxide or nickel hydroxide.

10. The copper foil for a printed circuit board according to claim 9, wherein, among all zinc atoms included in the nickel-zinc layer, 45 to 90% are existing therein as zinc oxide or zinc hydroxide.

11. A copper foil for a printed circuit board according to claim 9, wherein chromium add-on weight of the chromate film layer per unit area of the copper foil is 30 µg/dm$^2$ or more and 100 µg/dm$^2$ or less.

12. A copper foil for a printed circuit board according to claim 9, further comprising a silane coupling agent layer on the chromate film layer.

13. A copper foil for a printed circuit board according to claim 9, wherein the copper foil is an electrolytic copper foil, and the roughened surface is a rough face obtained during electrolytic plating, a face obtained by additionally performing roughening treatment to the rough face, or a face obtained by performing roughening treatment on a gloss surface of an electrolytic copper foil.

14. A copper foil for a printed circuit board according to claim 9, wherein the copper foil is a rolled copper foil and the roughened surface is a face obtained by performing roughening treatment to the rolled copper foil.

15. A copper clad laminate for a printed circuit board produced by laminating the copper foil for a printed circuit board according to claim 9, and a resin for a printed circuit board.

16. The copper foil for a printed circuit board according to claim 9, wherein the {nickel add-on weight per unit area/(nickel add-on weight per unit area+zinc add-on weight per unit area)} is 0.40 or more and 0.55 or less.

* * * * *